(12) United States Patent
Simoens-Seghers et al.

(10) Patent No.: US 10,542,645 B2
(45) Date of Patent: Jan. 21, 2020

(54) EMI PROTECTIVE SLEEVE AND METHOD OF CONSTRUCTION THEREOF

(71) Applicant: Federal-Mogul Powertrain, Inc., Southfield, MI (US)

(72) Inventors: Amelie Simoens-Seghers, Compiegne (FR); Alexa A. Woodruff, Bryn Mawr, PA (US); Amel Fathallah, Claye Souilly (FR); Tianqi Gao, Exton, PA (US); Julien Deltor, Gennevilliers (FR)

(73) Assignee: Federal-Mogul Powertrain LLC, Southfield, MI (US)

( * ) Notice: Subject to any disclaimer, the term of this patent is extended or adjusted under 35 U.S.C. 154(b) by 468 days.

(21) Appl. No.: 15/130,076

(22) Filed: Apr. 15, 2016

(65) Prior Publication Data

US 2016/0309626 A1 Oct. 20, 2016

Related U.S. Application Data

(60) Provisional application No. 62/149,200, filed on Apr. 17, 2015.

(51) Int. Cl.
*D03D 1/00* (2006.01)
*D03D 15/12* (2006.01)
(Continued)

(52) U.S. Cl.
CPC ......... *H05K 9/0043* (2013.01); *D03D 1/0035* (2013.01); *D03D 15/0088* (2013.01);
(Continued)

(58) Field of Classification Search
None
See application file for complete search history.

(56) References Cited

U.S. PATENT DOCUMENTS 4,684,762 A * 8/1987 Gladfelter .............. D03D 15/00
139/425 R
4,741,087 A 5/1988 Plummer, Jr.
(Continued)

FOREIGN PATENT DOCUMENTS

| CN | 101945755 A | 1/2011 | |
|---|---|---|---|
| DE | 10060909 A1 | 7/2001 | |
| WO | WO-2009089238 A2 * | 7/2009 | ............... B32B 1/08 |

OTHER PUBLICATIONS

International Search Report, dated Jul. 15, 2016 (PCT/US2016/028026).

*Primary Examiner* — Jenna L Johnson
(74) *Attorney, Agent, or Firm* — Robert L. Stearns; Dickinson Wright PLLC (57) ABSTRACT

A wrappable textile sleeve for protecting a conductive elongate member against at least one of EMI, RFI or ESD and method of construction thereof is provided. The sleeve includes a plurality of warp filaments and at least one weft filament woven with one another to form a woven substrate. The woven substrate has opposite sides extending lengthwise between opposite ends. The opposite sides are wrappable about a central longitudinal axis into overlapping relation with one another to circumferentially enclose the elongate member within a cavity of the sleeve. At least some of the warp filaments are provided as generally flat, thin conductive filaments shield the conductive elongate member against the effects of EMI, RFI and/or ESD.

32 Claims, 7 Drawing Sheets

(51) Int. Cl.
    *H01B 13/00*     (2006.01)
    *H05K 9/00*     (2006.01)
    *D03D 15/00*     (2006.01)

(52) U.S. Cl.
    CPC ......... *D03D 15/12* (2013.01); *H01B 13/0036* (2013.01); *H05K 9/0067* (2013.01)

(56) References Cited

U.S. PATENT DOCUMENTS

| | | | |
|---|---|---|---|
| 4,777,859 A | | 10/1988 | Plummer, Jr. |
| 4,786,541 A | * | 11/1988 | Nishimura ............ B29C 70/228 |
| | | | 428/102 |
| 4,943,477 A | * | 7/1990 | Kanamura ............... H01B 1/22 |
| | | | 174/388 |
| 6,639,148 B2 | * | 10/2003 | Marks ...................... D04C 1/06 |
| | | | 174/117 M |
| 6,924,244 B2 | | 8/2005 | Takagi et al. |
| 2006/0185872 A1 | | 8/2006 | Rodrigues et al. |
| 2006/0213234 A1 | | 9/2006 | Gladfelter et al. |
| 2007/0166495 A1 | | 7/2007 | Sellis et al. |
| 2008/0135119 A1 | | 6/2008 | Tonooka et al. |
| 2010/0084179 A1 | | 4/2010 | Harris et al. |
| 2010/0212952 A1 | * | 8/2010 | Abdelmoula .......... H01B 1/026 |
| | | | 174/390 |
| 2014/0069540 A1 | | 3/2014 | Chesnais et al. |
| 2014/0246109 A1 | * | 9/2014 | Walton ................. H02G 3/0481 |
| | | | 138/123 |
| 2014/0262478 A1 | | 9/2014 | Harris et al. |

\* cited by examiner

EMI PROTECTIVE SLEEVE AND METHOD OF CONSTRUCTION THEREOF

CROSS-REFERENCE TO RELATED APPLICATION

This application claims the benefit of U.S. Provisional Application Ser. No. 62/149,200, filed Apr. 17, 2015, which is incorporated herein by reference in its entirety.

BACKGROUND OF THE INVENTION

1. Technical Field

This invention relates generally to sleeves for protecting elongate members, and more particularly to wrappable sleeves that provide protection to elongate members contained within the sleeves against at least one of electromagnetic interference, radio frequency interference, and electrostatic discharge.

2. Related Art

It is known that electromagnetic interference (EMI), radio frequency interference (RFI), and electrostatic discharge (ESD) pose a potential problem to the proper functioning of electronic components caused by interference due to inductive coupling between nearby electrical conductors and propagating electromagnetic waves. For example, electrical currents in conductors associated with an electrical power system in an automobile may induce spurious signals in various electronic components, such as an electronic module which controls the functioning of the engine. Such interference could downgrade the performance of control modules or other components in the vehicle, thereby causing the vehicle to act other than as desired.

Similarly, inductive coupling between electrical wiring and the lines carrying data in a computer network or other communication system may have a corrupting effect on the data being transmitted over the network.

The adverse effects of EMI, RFI and ESD can be effectively eliminated by proper shielding and grounding of EMI, RFI and ESD sensitive components. For example, wires carrying control signals which may be subjected to unwanted interference may be shielded by using a protective sleeve. The sleeves are formed at least in part from standard round (as viewed in lateral cross-section) electrically conductive members, with the conductive members typically being grounded via a drain wire interlaced with the sleeve during manufacture of the sleeve. Typically, the conductive members take the form of round polymeric filaments, such as nylon, coated with a conductive metal, such as silver. The ground members are known to be intertwined along the length of the sleeve, and subsequently pulled away from the wall of the sleeve for attachment to a source of ground; however, upon pulling the ground members outwardly from the sleeve, a potential problem arises from the creation of an opening in the wall of the sleeve, through which EMI, RFI and/or ESD can pass.

While such RFI, EMI, and ESD sleeving can be generally effective at eliminating electrical interference, the sleeving can be relatively expensive in manufacture, particularly when expensive coatings, such as silver, are used, and can exhibit some inefficiency in conductive connections between the round conductive fiber constituents. In addition, if coated members are used, the conductive coating can be worn off, thereby impacting the ability of the sleeving to provide RFI, EMI, and/or ESD protection. Further yet, when round wire or round conductors are used to construct the entirety of protective barrier against RFI, EMI and ESD of the sleeve, the round conductive members are is typically provided as a fine wire, thereby having low tensile strength, and thus, tending to being damaged and broken in use, thereby reducing the shielding effectiveness of the sleeve and possibly causing wear against the protected wires within the sleeve and resulting in a potential source of arcing. In addition, with the wires being round, and further having a relatively small diameter, a large number of wires and/or turns/passes of the wire are needed to create an effective barrier to RFI, EMI, ESC, and thus, the mass and thickness of the sleeve wall is generally increased significantly, and further, the flexibility of the sleeve is generally significant reduced. Accordingly, a need for RFI, EMI, ESD shielding which is more economical in manufacture, flexible, light weight, reduced in size, efficient in use, and more reliable against wear and having an increased useful life, is needed.

A sleeve manufactured in accordance with the present invention overcomes or greatly minimizes at least those limitations of the sleeves described above and achieves desired goals mentioned above, among others as will be readily recognized by one skilled in the art upon viewing the disclosure herein.

SUMMARY OF THE INVENTION

A wrappable textile sleeve for protecting an elongate member against at least one of EMI, RFI or ESD is provided. The sleeve includes a plurality of warp filaments and at least one weft filament woven with one another to form a woven substrate. The woven substrate has opposite sides extending lengthwise between opposite ends. The opposite sides are wrappable about a central longitudinal axis into overlapping relation with one another to bound the elongate member within a cavity of the sleeve. To provide EMI, RFI and/or ESD protection to the elongate member, at least some of the warp filaments are provided as generally flat, thin conductive filaments.

In accordance with a further aspect of the invention, at least some of the weft filaments can be heat-set to bias the opposite sides into overlapping relation with one another to facilitate assembly of the sleeve about the elongate member.

In accordance with a further aspect of the invention, at least some of the weft filaments can be provided as conductive filaments to further enhance EMI, RFI and/or ESD protection provided by the sleeve.

In accordance with a further aspect of the invention, each of the warp filaments can be provided as generally flat, thin conductive filaments to enhance EMI, RFI and/or ESD protection provided by the sleeve.

In accordance with a further aspect of the invention, at least some of the warp filaments can be provided as nonconductive filaments to reduce cost, enhance manufacturability, coverage and flexibility of the sleeve.

In accordance with a further aspect of the invention, the nonconductive warp filaments can be provided as multifilaments to enhance coverage and flexibility.

In accordance with a further aspect of the invention, the nonconductive warp filaments can be provided as monofilaments to enhance resistance to abrasion.

In accordance with a further aspect of the invention, at least some of the generally flat, thin conductive warp filaments can be spaced from one another by round conductive warp filaments to enhance the ability to stitch inner and/or outer layers to the woven substrate.

In accordance with a further aspect of the invention, the round conductive warp filaments can be provided as generally flat, braided bundles including a plurality of the round conductive warp filaments to facilitate weaving an to maintain the sleeve having a low profile.

In accordance with a further aspect of the invention, the warp filaments and the weft filaments are woven in a pattern selected from at least one of the group consisting of a plain weave pattern, a basket weave pattern, a twill weave pattern, and a mock leno weave pattern.

In accordance with another aspect of the invention, at least some of the generally flat, thin conductive warp filaments can include a plurality of generally flat, thin conductive filaments stacked in overlapping relation with one another to form discrete bundles of the generally flat, thin conductive filaments to enhance the EMI, RFI and/or ESD protection of the sleeve without having to increase the width of the sleeve extending between the opposite sides.

In accordance with another aspect of the invention, at least one of the bundled, generally flat thin conductive filaments can be extended for use as a ground member.

In accordance with another aspect of the invention, the ground member can be woven in a different weave pattern from the remaining bundled, generally flat thin conductive filaments to facilitate pulling the ground member outwardly from the remaining bundled, generally flat thin conductive filaments.

In accordance with another aspect of the invention, the ground member can be woven in overlying relation with a generally flat thin conductive filament to prevent forming an opening upon manipulating the ground member for attachment to a ground.

In accordance with another aspect of the invention, at least one layer can be fixed to the woven substrate to provide additional protection to the elongate member contained in the cavity of the sleeve.

In accordance with another aspect of the invention, the at least one layer can be stitched to the woven substrate via stitches passing through the generally flat, braided bundles of round conductive warp filaments.

In accordance with another aspect of the invention, the at least one layer fixed to the woven substrate can include an inner layer fixed to an inwardly facing surface of the woven substrate and an outer layer fixed to an outwardly facing surface of the woven substrate, thereby sandwiching the woven substrate between the inner and outer layers.

In accordance with another aspect of the invention, the inner layer can be provided as an impervious sheet of material to provide enhanced protection against the ingress of fluid into the cavity of the sleeve, thereby providing enhanced protection to the elongate member contained in the cavity.

In accordance with another aspect of the invention, the inner layer can be provided as an impervious sheet of PTFE film.

In accordance with another aspect of the invention, the outer layer can be provided as a textile layer of interlaced material to provide enhanced protection against abrasion, heat, fluids and/or arc resistance.

In accordance with another aspect of the invention, the outer layer can be provided as a textile layer including fire resistant filaments, such as Nomex, by way of example and without limitation.

In accordance with another aspect of the invention, the outer layer can be provided as a textile layer including PEEK, by way of example and without limitation.

In accordance with another aspect of the invention, the outer layer can be a woven layer of strong, abrasion resistance yarns, including monofilaments and/or multifilaments.

In accordance with a further aspect of the invention, a method of constructing a wrappable textile sleeve for protecting elongate members against at least one of EMI, RFI or ESD is provided. The method includes weaving a plurality of warp filaments with at least one weft filament to form a woven substrate having opposite sides extending lengthwise between opposite ends, wherein the opposite sides are wrappable about a central longitudinal axis into overlapping relation with one another. The method further includes weaving at least some of the warp filaments as generally flat, thin conductive filaments to provide EMI, RFI and/or ESD protection to the elongate member contained in a cavity of the sleeve.

In accordance with a further aspect of the invention, the method can further include heat-setting at least some of the weft filaments to bias the opposite sides into overlapping relation with one another.

In accordance with a further aspect of the invention, the method can further include weaving at least some of the weft filaments as conductive filaments.

In accordance with a further aspect of the invention, the method can further include weaving at least some of the weft filaments as heat-settable yarn served or twisted with conductive filaments.

In accordance with a further aspect of the invention, the method can further include weaving each or substantially all of the warp filaments as generally flat, thin conductive filaments.

In accordance with a further aspect of the invention, the method can further include weaving a plurality of the generally flat, thin conductive warp filaments in stacked relation on one another to enhance the EMI, RFI and/or ESD protection of the sleeve without having to increase the width of the sleeve extending between the opposite sides. The stacked warp filaments can be stacked including two or more of the generally flat, thin conductive warp filaments. It is to be appreciated that although least some of the generally flat, thin conductive warp filaments can be stacked one on top of another, others may remain as single strips of filaments.

In accordance with a further aspect of the invention, the method can further include providing at least one of the generally flat, thin conductive filaments in the stacked warped filaments as an extendable ground member.

In accordance with a further aspect of the invention, the method can further include weaving a ground member in overlying relation with at least one of the generally flat, thin conductive filaments.

In accordance with a further aspect of the invention, the method can further include weaving at least some of the warp filaments as nonconductive warp filaments.

In accordance with a further aspect of the invention, the method can further include weaving the nonconductive warp filaments as multifilaments.

In accordance with a further aspect of the invention, the method can further include weaving the nonconductive warp filaments as monofilaments.

In accordance with a further aspect of the invention, the method can further include weaving at least some of the warp filaments as round conductive filaments and spacing adjacent ones of the generally flat, thin conductive filaments from one another with the round warp conductive filaments.

In accordance with a further aspect of the invention, the method can further include weaving the round conductive warp filaments as bundles of generally flat, braided conductive filaments.

In accordance with a further aspect of the invention, the method can further include weaving the warp filaments and the weft filaments in a pattern selected from the group consisting of a plain weave pattern, a basket weave pattern, a twill weave pattern, and a mock leno weave pattern.

In accordance with a further aspect of the invention, the method can further include weaving a plurality of the generally flat, thin conductive warp filaments in stacked relation on one another to enhance the EMI, RFI and/or ESD protection of the sleeve without having to increase the width of the sleeve extending between the opposite sides. The stacked warp filaments can be stacked including two or more of the generally flat, thin conductive warp filaments. It is to be appreciated that although least some of the generally flat, thin conductive warp filaments can be stacked one on top of another, others may remain as single strips of filaments.

In accordance with a further aspect of the invention, the method can further include fixing at least one additional layer to an outer and/or inner surface of the woven substrate to provide additional protection to the elongate member contained in the cavity of the sleeve.

In accordance with a further aspect of the invention, the method can further include fixing an inner layer to an inwardly facing surface of the woven substrate and fixing an outer layer to an outwardly facing surface of the woven substrate, thereby sandwiching the woven substrate between the inner and outer layers.

In accordance with another aspect of the invention, the method can include stitching the inner and/or outer layer to the woven substrate through a bundle of warp monofilaments.

In accordance with another aspect of the invention, the method can include stitching the inner and/or outer layer to the woven substrate through bundles of warp monofilaments adjacent the opposite sides.

In accordance with a further aspect of the invention, the method can further include providing the inner layer as an impervious sheet of material to provide enhanced protection against the ingress of fluid into the cavity of the sleeve, thereby providing enhanced protection to the elongate member contained in the cavity.

In accordance with a further aspect of the invention, the method can further include providing the outer layer as a textile layer of interlaced material to provide enhanced protection against abrasion, heat, fluids and/or arc resistance.

Accordingly, woven sleeves produced at least in part with flat, thin conductive warp filaments in accordance with the invention are useful for shielding elongate members from EMI, RFI and/or ESD, wherein the sleeves can be constructed having any desired shape, whether flat, cylindrical, box shaped, or otherwise. In addition, the sleeves can be made to accommodate virtually any package size by adjusting the fabricated width and length of the woven substrate in manufacture, and can be equipped with a variety of closure mechanisms, if desired. Further, the sleeves manufactured with thin, flat conductive warp filaments in accordance with the invention are at least somewhat flexible in 3-D without affecting their protective strength, conductivity, and thus shielding ability against EMI, ESD and/or RFI, thereby allowing the sleeves to bend at least slightly, as needed, to best route the elongate members without affecting the EMI, ESD and/or RFI protection provided by the sleeves.

BRIEF DESCRIPTION OF THE DRAWINGS

These and other features and advantages will become readily apparent to those skilled in the art in view of the following detailed description of the presently preferred embodiments and best mode, appended claims, and accompanying drawings, in which:

DETAILED DESCRIPTION OF PREFERRED EMBODIMENTS

Figures 1, 1A, 1B:
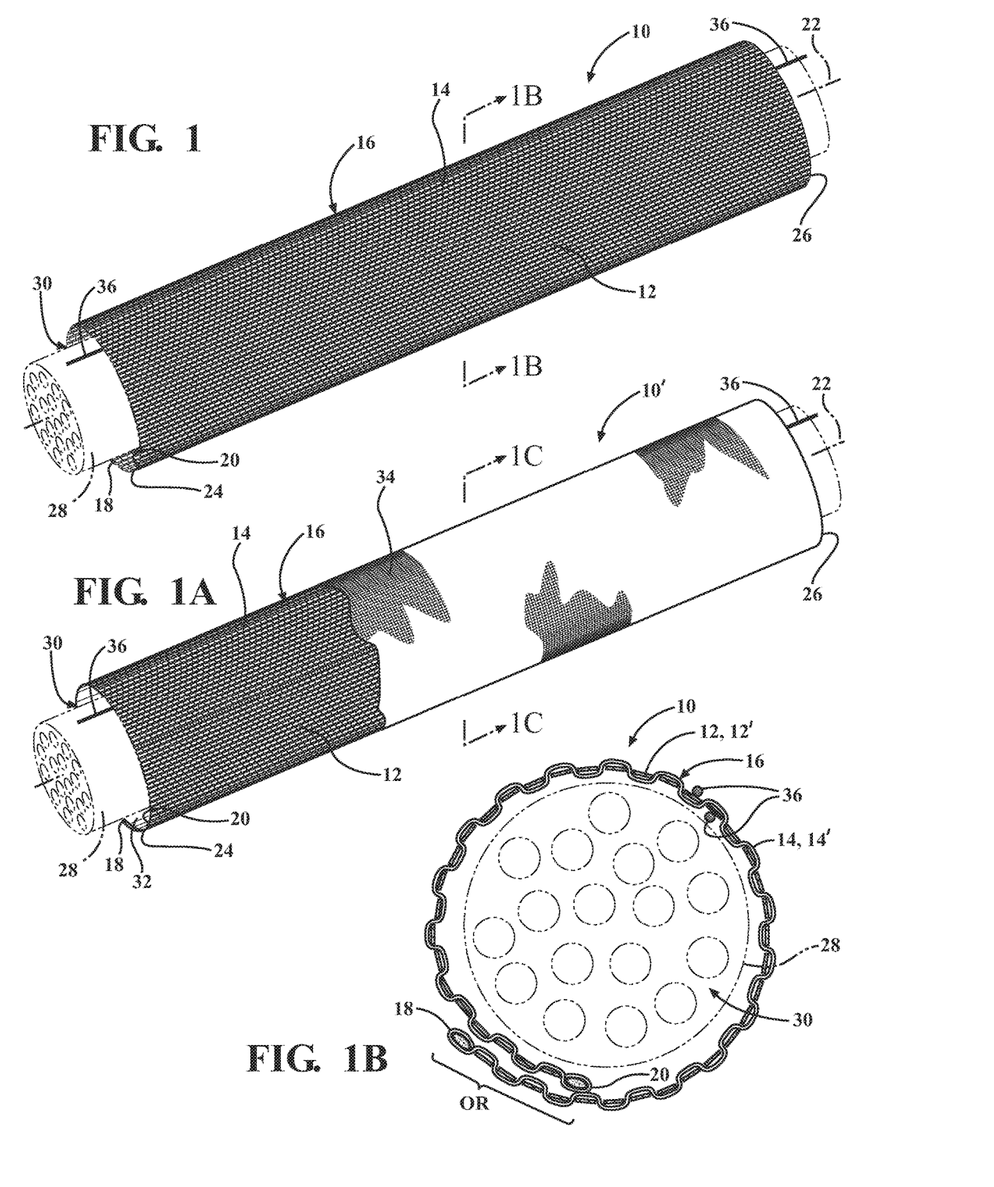
FIG. 1 is a schematic perspective view of a wrappable sleeve constructed in accordance with one presently preferred embodiment of the invention shown wrapped about an elongate member to be protected.
FIG. 1A is a schematic perspective view of a wrappable sleeve constructed in accordance with another presently preferred embodiment of the invention shown wrapped about an elongate member to be protected.
FIG. 1B is a cross-sectional view of the sleeve of FIG. 1 taken generally along the line 1B-1B.
Figure 1C:
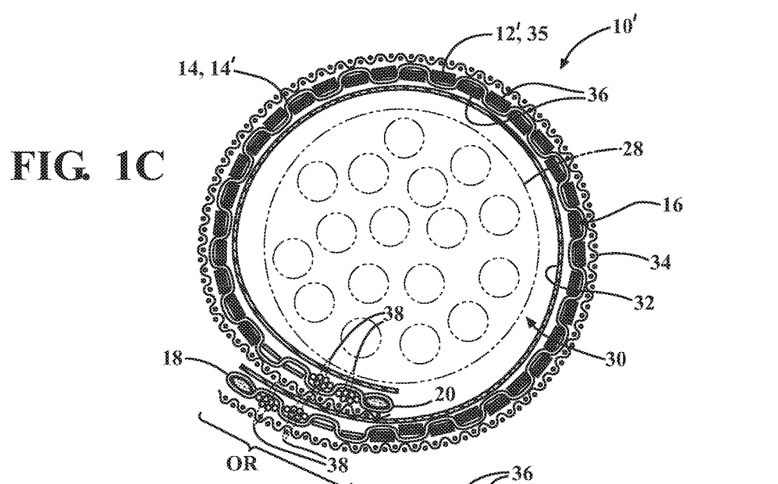
FIG. 1C is a cross-sectional view of the sleeve of FIG. 1A taken generally along the line 1C-1C.

Referring in more detail to the drawings, FIG. 1 shows generally a wrappable, protective sleeve, referred to hereafter simply as sleeve 10, constructed in accordance with one presently preferred embodiment of the invention. The sleeve 10 includes a plurality of warp filaments 12 and at least one or a plurality of weft filaments 14 woven with one another to form an EMI, RFI and/or ESD protective woven substrate, also referred to simply as wall 16. The wall 16 has opposite sides 18, 20 extending lengthwise generally parallel to a central longitudinal axis 22 between opposite ends 24, 26. The opposite sides 18, 20 are wrappable about the central longitudinal axis 22 into overlapping relation with one another to bound an elongate member 28 to be protected within a circumferentially enclosed cavity 30 of the sleeve 10. At least some of the warp filaments 12 are provided as generally flat, thin, conductive filaments 12', having a generally rectilinear profile as viewed in lateral cross-section taken generally transversely to the central longitudinal axis 22, to provide the sleeve 10 with at least one of electromagnetic interference (EMI), radio frequency interference (RFI), and/or electrostatic discharge (ESD) protection capability for the elongate member 28 bundled within the sleeve 10. Once enclosed, the elongate member 28, such as an electric cable or bundle wires, receives maximum protection from any unwanted interference, such as inductive interference, thereby providing any electrical components, such as control motors, for example, connected to the bundle of wires 28 maximum operating performance. In addition, the sleeve 10 prevents the bundled wires 28 from interfering with any adjacent electrical components. The warp and weft filaments 12, 14 of the wall 16 can be woven in a variety of configurations and patterns as discussed in more detail below, including an individual pattern or combinations of the patterns as shown in FIGS. 6A-6H, and thus, FIG. 1 is primarily intended to illustrate the wrappable nature of the wall 16.

In accordance with a further aspect of the invention, the sleeve 10 can be constructed as a self-wrapping sleeve, such that the wall 16 is automatically biased to curl about the central longitudinal axis 22 to bring the opposite sides 18, 20 into their overlapping relation. The self-wrapping bias can be imparted within the wall 16 of the sleeve 10 via heat-setting at least one weft filament 14 or a plurality of weft filaments 14. Accordingly, at least one or a plurality of the weft filaments 14 can be provided as a heat-settable polymeric filament or filaments, wherein the heat-settable weft filament or filaments 14, whether some of all, are preferably monofilaments of a thermoplastic, such as, by way of example and without limitation, polyester, thereby allowing the sleeve 10 to be heat-set or otherwise biased into a tubular form.

In accordance with a further aspect of the invention, at least some of the warp and/or weft filaments 12, 14 can be provided as non-conductive filaments 12''', whether monofilaments, which would primarily enhance resistance of the wall 16 to abrasion, and/or multifilaments, which would primarily provide the wall 16 with enhanced barrier protection, also referred to as coverage, to inhibit the ingress of contaminants into the cavity 30, softer texture, enhanced drape, and enhanced noise dampening characteristics. Depending on the application, the non-conductive filaments can be formed from, by way of example and without limitations, polyester, nylon, polypropylene, polyethylene, acrylic, cotton, rayon, and fire retardant (FR) versions of all the aforementioned materials, though high temperature ratings are generally not required if provided as FR materials. If high temperature ratings are desired along with FR capabilities, then some presently preferred non-conductive members include m-aramid (Nomex, Conex, Kermel), p-aramid (Kevlar, Twaron, Technora), PEI (Ultem), PPS, and PEEK, for example.

Figure 5:
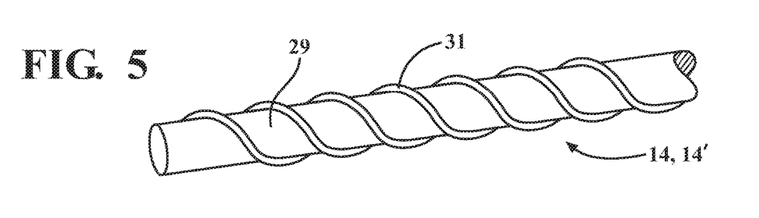
FIG. 5 is a partial side view of a weft filament shown in accordance with one aspect of the invention.

In accordance with a further aspect of the invention, at least some of the weft filaments 14 can be provided as conductive weft filaments 14' to further enhance EMI, RFI and/or ESD protection. If at least some of the weft filaments 14 are provided as conductive weft filaments 14', the conductive weft filaments 14' are preferably provided as relatively fine, round wire filaments or conductive yarns, such as metallized yarns, by way of example and without limitation, to facilitate the sleeve's ability to self-wrap into the tubular configuration and reduce weight. To enhance the strength and manufacturability, the conductive weft filaments 14' can further include a fine wire filament 31 served or twisted about a non-conductive weft filament 14, such as a non-conductive monofilament or non-conductive multifilament, both of which can be provided as being heat-settable filaments 29 (FIG. 5), thereby providing two functions in one yarn, including added EMI, RFI and/or ESD protection via the conductive wire 31 and heat-settable, self-wrapping capacity to the wall 16 via the heat-settable, non-conductive filament 29. It is to be recognized the hybrid yarn including both filaments 29, 31 can be used in any of the embodiments discussed herein, or that the conductive weft filaments 14' and heat-settable weft filaments 29 could be incorporated separately from one another in any of the embodiments discussed herein. It is to be further understood that the primary strength of the sleeve is provided by the increased strength of the flat, relatively thin conductive warp filaments 12', and that the conductive weft filaments 14' can be provided as relatively small diameter wires as a result of having the relatively increased strength flat, relatively thin conductive warp filaments 12'.

Figure 2A:
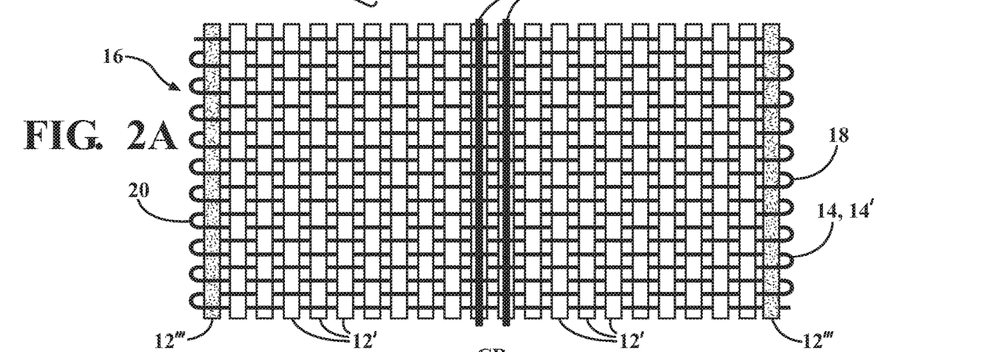
FIGS. 2A-2D are schematic plan views illustrating different embodiments of warp filament patterns of sleeves constructed in accordance with different embodiments of the invention, with the weft filaments being shown in phantom for enhanced clarity.
Figure 2B:
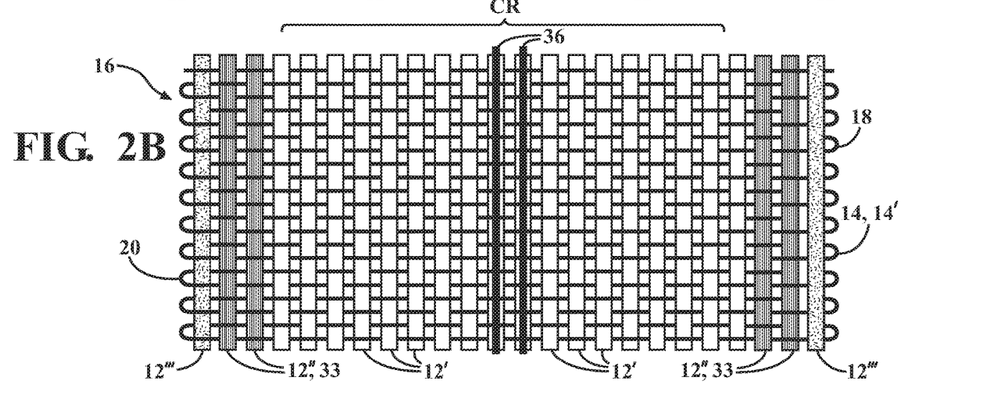
Figure 2C:
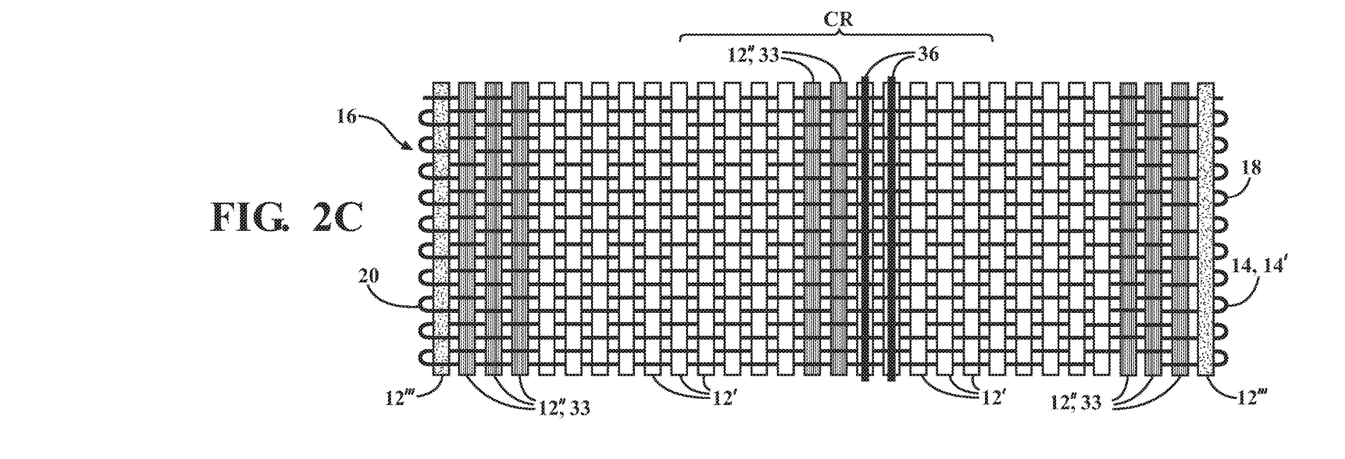
Figure 2D:
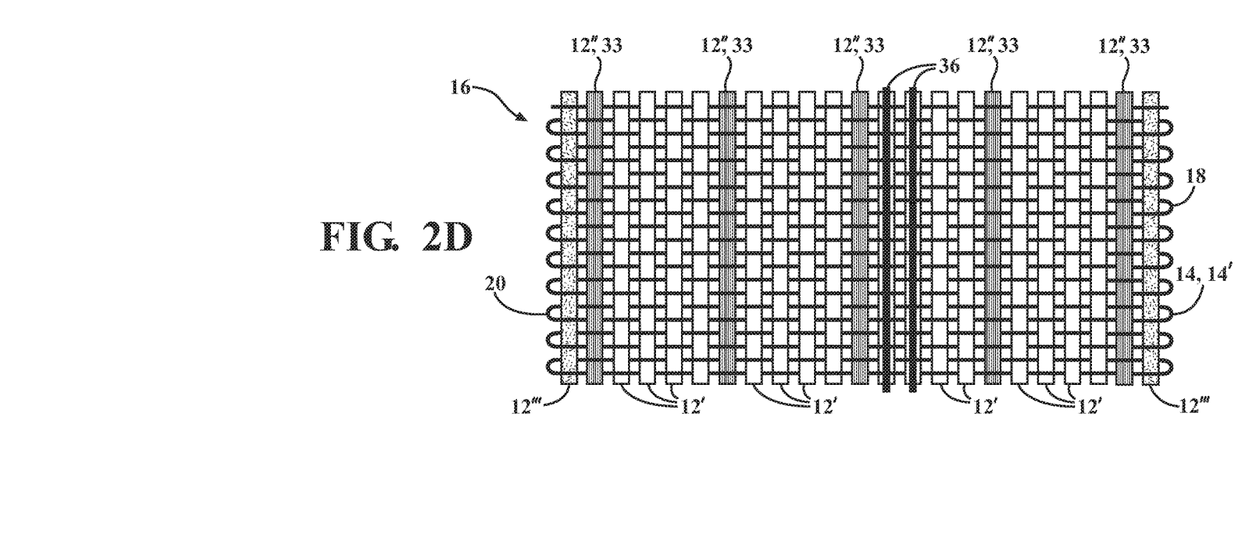
Figure 3A:
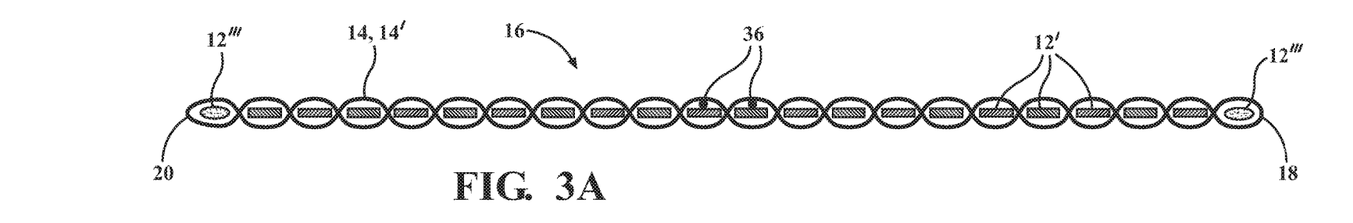
FIG. 3A is a schematic cross-sectional view of a woven wall of a sleeve having a warp filament pattern of FIG. 2A.
Figure 3B:
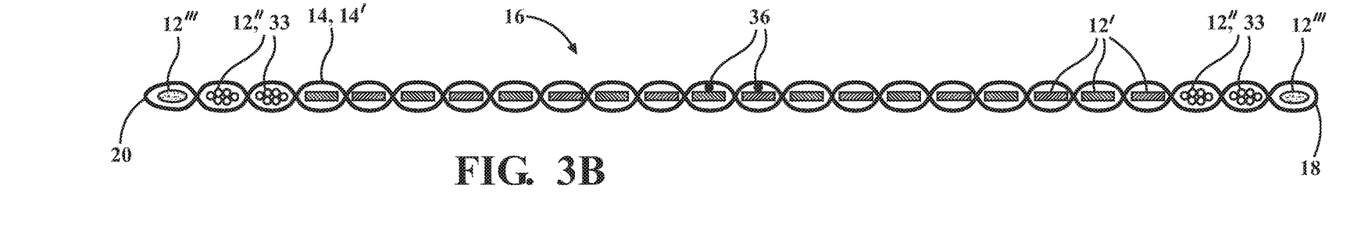
FIG. 3B is a schematic cross-sectional view of a woven wall of a sleeve having a warp filament pattern of FIG. 2B.
Figure 3C:
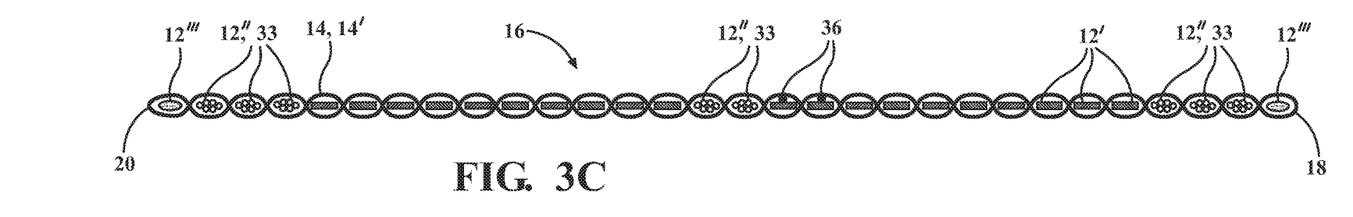
FIG. 3C is a schematic cross-sectional view of a woven wall of a sleeve having a warp filament pattern of FIG. 2C.
Figure 3D:
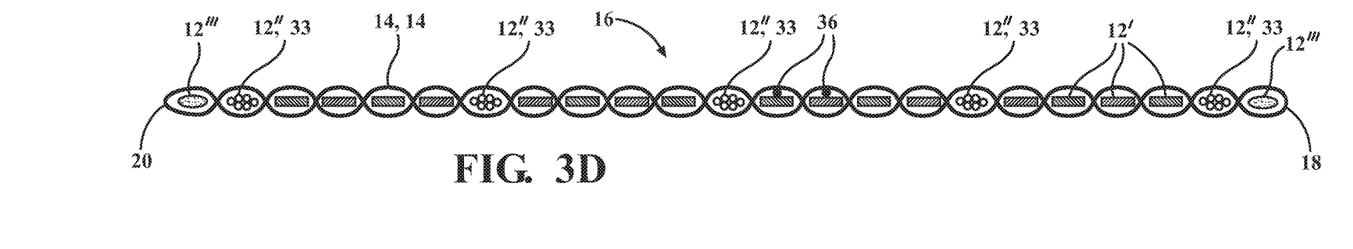
FIG. 3D is a schematic cross-sectional view of a woven wall of a sleeve having a warp filament pattern of FIG. 2D.
Figure 3E:
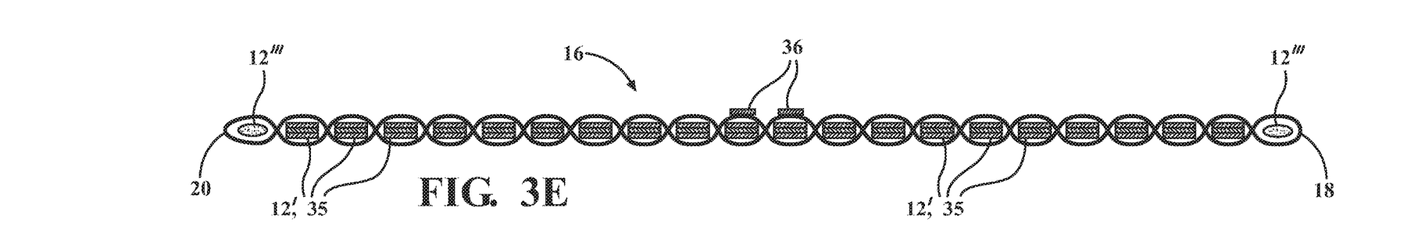
FIG. 3E is a schematic cross-sectional view of a wall woven in accordance with a further aspect of the invention.
Figure 3F:
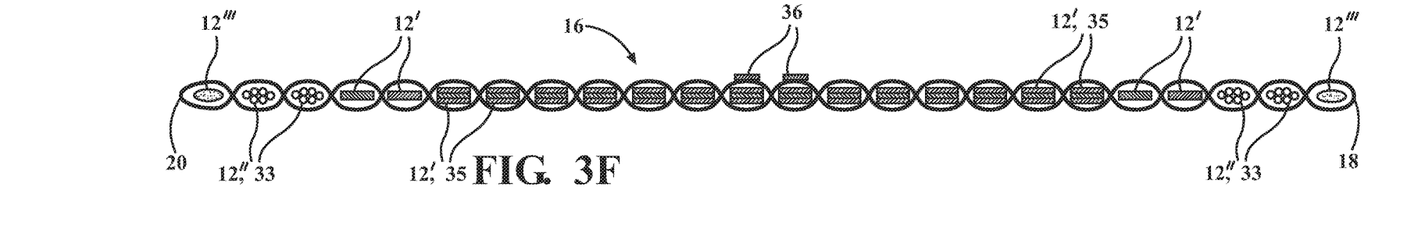
FIG. 3F is a schematic cross-sectional view of a wall woven in accordance with yet a further aspect of the invention.

In addition to the flat, relatively thin conductive warp filaments 12', in accordance with a further aspect of the invention, at least some of the warp filaments 12 can be provided as round conductive warp filaments 12'' of fine wire, and further yet, at least some of the warp filaments 12 can be provided as non-conductive warp filaments 12''', whether monofilaments and/or multifilaments, which has been found to improve the manufacturability of the wall 16. The flat conductive warp filaments 12' can be provided between about 90-100 percent content, thereby providing the vast majority of EMI, RFI and/or ESD protection to the sleeve 10, and the conductive round warp filaments 12'' can be provided between about 10-0 percent content, mainly to facilitate manufacture of a multilayered sleeve, as discussed further below. In FIGS. 2A and 3A, substantially all the warp filaments 12 are provided as flat, relatively thin conductive warp filaments 12', with the sides 18, 20 having a non-conductive yarn or plurality of non-conductive yarns 12''. In FIGS. 2B and 3B, the flat, relatively thin conductive warp filaments 12' are woven throughout a central region CR between the opposite sides 18, 20, while the fine conductive round warp filaments 12'' are woven adjacent each of the opposite sides 18, 20, shown as being woven in discrete bundles 33. Each bundle 33 includes a plurality of the fine conductive round warp filaments 12'' interlaced with one another, such as by being braided with one another, also referred to as a mini-braid, to form the bundles 33 as being generally flat, generally similar in shape to the flat, relatively thin conductive warp filaments 12'. The non-conductive warp filaments 12''' can be woven along at least one of the sides 18, 20, shown as forming both the outer and inner sides 18, 20, by way of example and without limitation. In FIGS. 2C and 3C, the wall 16 is constructed similarly to the wall of FIG. 2B; however, a portion of the central region CR of the wall 16 is woven with conductive round warp filaments 12'', with all else remaining the same or substantially the same as discussed for FIG. 2B. In FIGS. 2D and 3D, a mixture of conductive flat, thin warp filaments 12', conductive round warp filaments 12'', and non-conductive warp filaments 12''' are woven across the width of the wall 16 between the opposite sides 18, 20, as shown. Of course, it should be recognized that the pattern in which the various types of warp filaments 12', 12'', 12''' are woven can be selected as desired for the intended application.

In FIGS. 3E-3H, weave patterns similar to corresponding FIGS. 3A-3D are shown; however, at least some of the flat, relatively thin conductive warp filaments 12' are shown as being provided as discrete bundles 35 including a plurality of flat, relatively thin conductive warp filaments 12' stacked in overlying relation with one another. In the embodiment illustrated, by way of example and without limitation, three conductive warp filaments 12' are shown in stacked relation with one another across a substantial portion of the wall 16 between the opposite sides 18, 20, with a plurality of the bundled conductive round warp filaments 12" being woven in opposite edge regions immediately adjacent and extending to the opposite sides 18, 20. The plurality of conductive round warp filaments 12" within each opposite edge region can be woven as individual discrete bundles 33 of filaments 12" as discussed above, with each bundle 33 including a plurality of the conductive round wire filaments 12" interlaced in side-by-side, generally planar relation with one another, such that each filament 12" within a common bundle 33 is woven to undulate over and under a common weft filament 14.

Figure 3G:
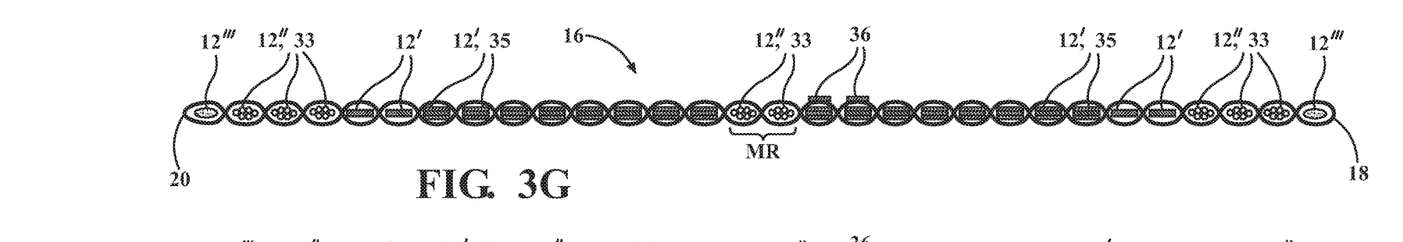
FIG. 3G is a schematic cross-sectional view of a wall woven in accordance with yet a further aspect of the invention.
Figure 3H:
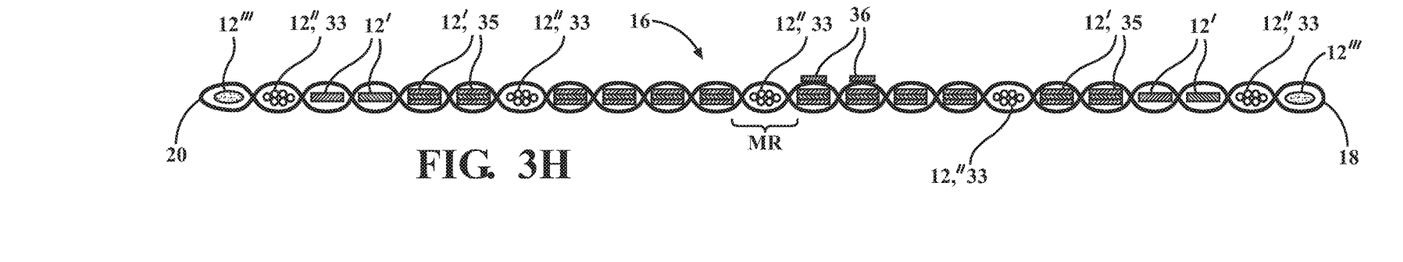
FIG. 3H is a schematic cross-sectional view of a wall woven in accordance with yet a further aspect of the invention.
Figure 4A:
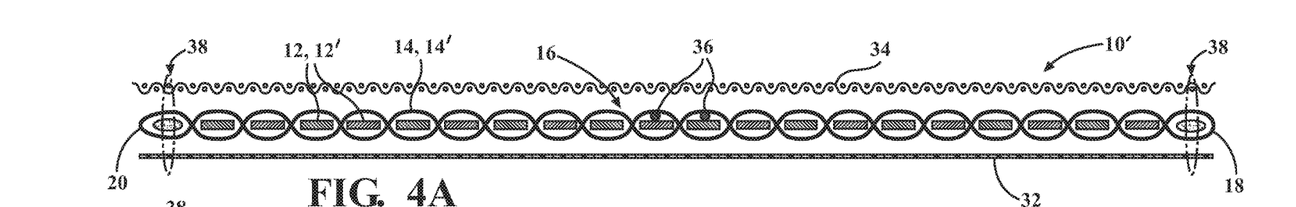
FIGS. 4A-4D are views similar to FIGS. 3A-3D showing inner and outer layers fixed to the intermediate woven layers of corresponding FIGS. 3A-3D of the sleeve generally shown in FIG. 1A.
Figure 4B:
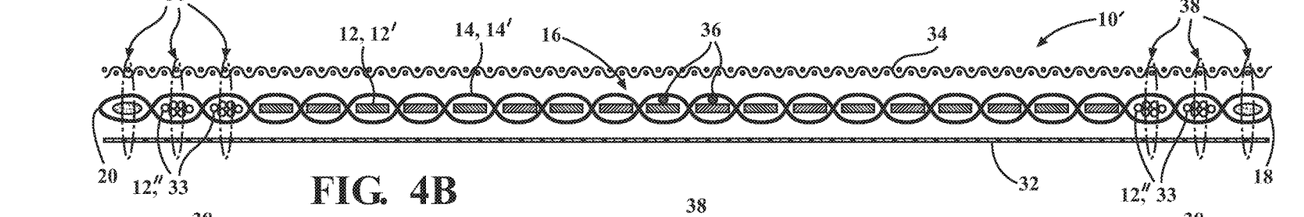
Figure 4C:
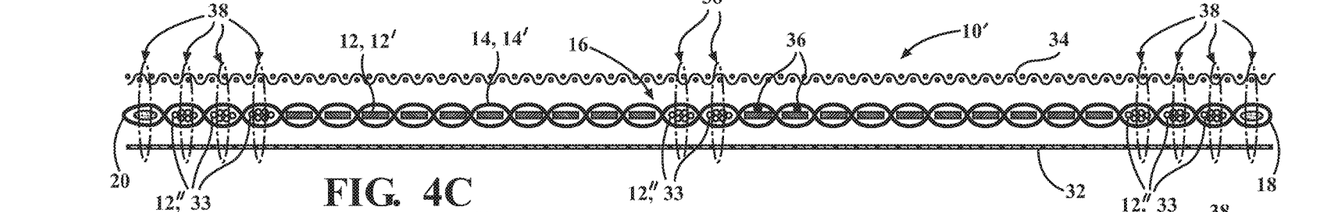
Figure 4D:
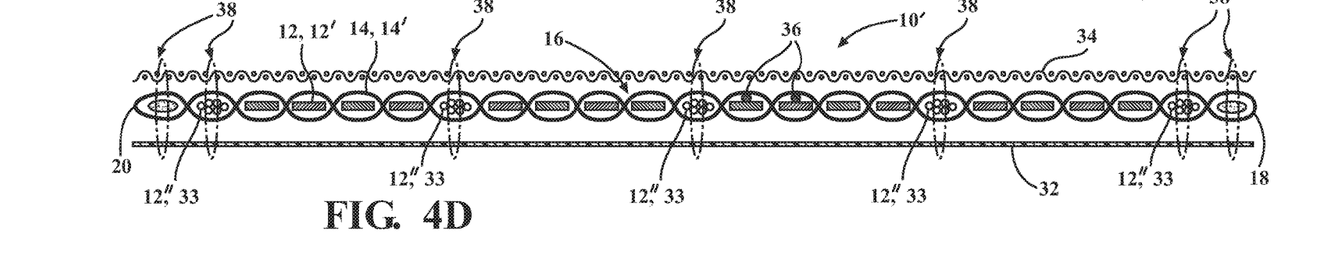

In FIGS. 3G-3H, weave patterns similar to FIGS. 3C-3D are shown, by way of example and without limitation, wherein a plurality of conductive warp filaments 12' are shown in stacked relation with one another forming discrete bundles 35 on opposite sides of a mid-region MR. The mid-region MR and regions adjacent each of the opposite sides 18, 20 are each woven including a plurality of conductive round warp filaments 12". The plurality of conductive round warp filaments 12" within each the mid-region MR and within the opposite edge regions can be woven as individual discrete bundles 33 of filaments 12", with each bundle 33 including a plurality of the conductive round wire filaments 12" in loosely braided side-by-side relation with one another, such that each filament 12" within a common bundle 33 is woven to undulate over and under a common weft filament. A plurality of single, flat, conductive warp filaments 12' are shown extending between the stacked bundles 35 of flat, conductive filaments 12' and the bundles 35 of conductive round filaments 12". The single, flat conductive warp filaments 12' can be brought into overlapping relation with one another upon wrapping the wall 16 into its tubular configuration, thereby effectively forming a dual layer of the single, flat, conductive warp filaments 12' to enhance the EMI, RFI and/or ESD protection in an overlapping region OR. Meanwhile, the stacked bundles 35 of conductive warp filaments 12' already provide enhanced EMI, RFI and/or ESD protection, while at the same time maintaining a low profile and weight, due the thin shape of the flat filaments 12'.

It is to be recognized that each embodiment discussed above and illustrated in FIGS. 2A-2D and 3A-3D can include such bundles 33 of conductive round warp filaments 12" where the round warp filaments 12" are discussed and illustrated. The bundles 33 of conductive round wire filaments 12" facilitate attachment of additional layers to the wall 16, such as inner and outer layers 32, 34, to form a sleeve 10' in accordance with another aspect of the invention, as shown in FIGS. 1A, 1C and 4A-4D. The bundles 33 freely allow a needle stitching the layers 16, 32, 34 together to readily pass through the bundles 33 and between adjacent ones of the conductive round warp filaments 12" to form stitches 38 fixing the layers together. The inner layer 32 is shown fixed to an inwardly facing surface of the intermediate woven substrate 16 and the outer layer 34 is shown fixed to an outwardly facing surface of the intermediate woven substrate 16 via the stitches 38. The inner layer 32 can be provided as an impervious sheet of material, such as a PTFE film, by way of example and without limitation, to prevent the ingress of fluid into the cavity 30 of the sleeve 10'. The outer layer 34 can be provided as a strong, abrasion resistant textile layer of interlaced yarns, including woven monofilaments and/or multifilaments, including fire resistant filaments, PEEK filaments, or otherwise as desired.

The thin, flat conductive warp filaments 12' can be provided as any suitable solid, flattened conductive strips or bands of metal material, with copper having been found to be a particularly effective material in performing the EMI, ESD, RFI function. To facilitate flexibility and reduced weight, the thin, flat conductive warp filaments 12' can be provided having a thickness between about 0.01-0.06 mm and a width between about 0.1-1.2 mm, by way of example and without limitation.

The sleeve 10 further includes a plurality of drain members, also referred to as ground members 36, woven as warp members, and ultimately extending between the opposite ends 24, 26. The ground members 36 can be provided as a wire material as desired for the intended application, such as twisted round wires, braided round wires, flat wires, and can include a tin coated copper or nickel coated copper material, by way of example and without limitation, and can be provided having any desired diameter, such as between about 0.1-2 mm, by way of example and without limitation. The plurality of ground members 36 are provided in a group or groups of two or more woven ground members 36 in side-by-side, abutting relation with one another. If provided a multiple groups, the groups can be dispersed about the circumference of the sleeve 10, 10', as desired. With the ground members 36 being formed in groups or two or more ground members 36, in application, the grouped ground members 36 always maintain contact with one another, particularly upon pulling an end of separate ones of the ground members 36 in opposite axial directions from one another to extend a free end of the separate ground members axially outwardly from the ends 24, 26 of the sleeve 10 for attachment to a source of ground, as described in U.S. Pat. No. 6,639,148, which is incorporated herein by reference in its entirety. An important enhancement is provided by the ground members 36 as a result of their being woven in overlying or underlying relation with a conductive warp filament 12', 12," whether separately therefrom or in combination therewith. As a result of being radially aligned with one at least of the conductive warp filaments 12', 12," upon pulling the individual ground members 36 to their axially extended, installed position, there are no openings or voids formed in the wall 16 of the sleeve 10 which would allow EMI, RFI, ESD to pass through. Accordingly, enhanced protection against EMI, RFI, ESD is provided by the wall 16, even upon extending the ground members to their extended in-use position, as a result of the presence of an underlying or overlying conductive warp filament 12', 12".

In addition to providing the ground members 36 as separated wires, as described above, the ground members 36 can be provided via one of the generally flat, thin conductive filaments 12' woven in the stacked bundles 35 of conductive warped filaments 12'. Upon cutting the wall 16 to length, one of the flat conductive filaments 12' can be pulled axially outwardly from each end 24, 26 for attachment to ground. To further facilitate pulling the ground members 36 outwardly for attachment to ground, the conductive filaments 12' for use as the ground member 36 within a bundle 35 can be woven having a different weave pattern from the remaining flat conductive filaments 12' in the bundle 35. By way of example and without limitation, the selected flat conductive filament 12' intended to be used as the ground member 36 can be woven in a twill, basket or satin weave pattern, while the remaining flat conductive filament or filaments 12' in the stacked bundle 35 can be woven in a more tight weave pattern, such as a plain weave pattern, wherein the various types of weave patterns are shown in FIGS. 6A-6H. Of course, one skilled in the art, upon view the disclosure herein, will readily recognize different patterns to allow the intended ground member 36 to be more easily pulled axially outwardly from the sleeve 10, while maintaining the non-ground members within the wall 16, as intended. It should be recognized that the ground members 36, if provided as separate round ground members from the flat conductive filaments 12', can also be woven having a different weave pattern from the remaining warp members to facilitate pulling the ground member 36 outwardly for attachment to ground.

Figure 6A:
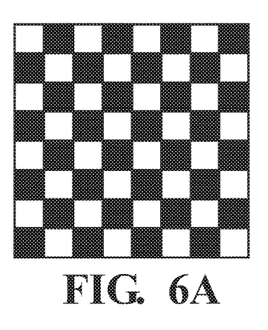
FIGS. 6A-6H illustrate different weave patterns used to construct sleeves in accordance with different aspects of the invention.
Figure 6B:
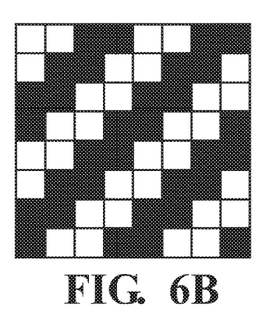
Figure 6C:
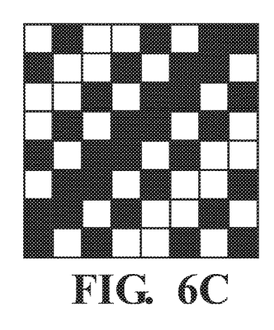
Figure 6D:
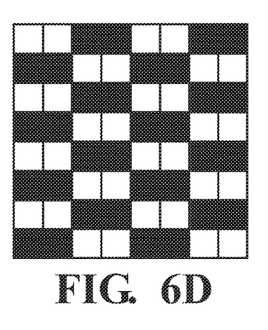
Figure 6E:
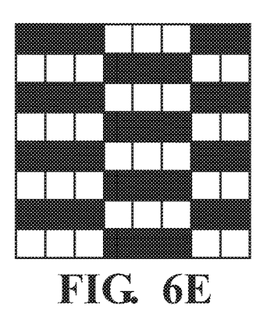
Figure 6F:
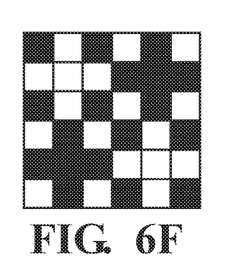
Figure 6G:
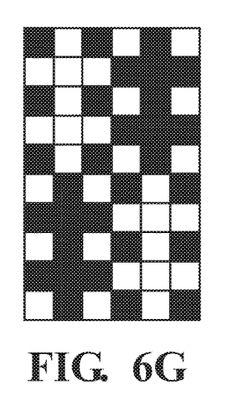
Figure 6H:
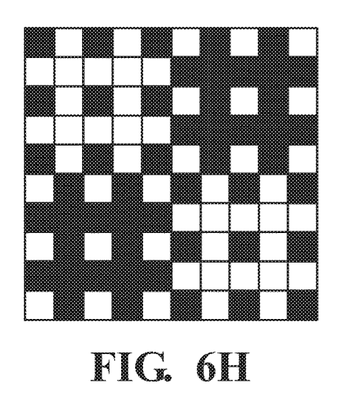

It should be recognized that sleeves 10 constructed in accordance with the invention can be constructed to take on any desired protective sleeve form, such as generally flat, or round, for example. Accordingly, the invention is not limited to the profile of the sleeve, and thus, contemplates the manufacture and construction of any profile sleeve that provides a secure, durable, flexible covering for organizing and protecting elongate members 28, such as cables and wiring, from EMI, RFI and/or ESD. FIGS. 6A-6H illustrate different weave patterns used to construct sleeves in accordance with different embodiments of the invention. FIG. 6A illustrates a plain weave pattern; FIGS. 6B and 6C illustrate different twill patterns; FIGS. 6D-6E illustrate different basket weave patterns, with FIG. 6D often being referred to as a standard (2×1) basket weave, while FIG. 56 is a (3×1) basket weave; and FIGS. 6F-6H illustrate different mock leno weave patterns. It is contemplated that variations of the weave patterns depicted are possible, and thus, the weave patterns illustrated are intended to be exemplary and non-limiting. It is further contemplated that a sleeve constructed in accordance with the invention can include one or more of the different weave patterns, such as, by way of example and without limitation, a plain weave pattern adjacent the opposite sides 18, 20, and a different weave pattern or patterns throughout the central region CR, such as a twill and/or basket weave pattern.

Sleeves 10 constructed in accordance with the invention have been found empirically to provide optimal resistivity and EMI, ESD, RFI shielding at low and high frequencies to elongate members 28 contained therein while also having a low mass, reduced cross-section profile, and increased flexibility as a result of the flat, thin conductive warp filaments 12' that provide a high level of surface coverage and protection against EMI, ESD and/or RFI. The reduction in mass and increase in flexibility comes from the increase in surface area coverage and reduced relative thickness and mass of the flat, thin conductive warp filaments 12' as compared to round wires providing an equivalent degree of protection against EMI, ESD and/or RFI. Further, the flat, thin conductive warp filaments 12' have an increased tensile strength compared to fine round wire, thereby reducing the risk of damage and possible arcing in use. Sleeves 10, 10' constructed in accordance with the invention are further economical in manufacture and can be made to conform to a multitude of widths, heights and lengths and configurations for use in a variety of applications.

Obviously, many modifications and variations of the present invention are possible in light of the above teachings. It is, therefore, to be understood that within the scope of the appended claims, the invention may be practiced otherwise than as specifically described.

What is claimed is:

1. A wrappable textile sleeve for protecting elongate members against at least one of EMI, RFI or ESD, comprising:
a plurality of warp filaments;
at least one weft filament;
said warp filaments being woven with said at least one weft filament to form a woven substrate, said substrate having opposite sides extending lengthwise between opposite ends, said opposite sides being wrappable about a central longitudinal axis of said sleeve into overlapping relation with one another; and
wherein at least some of said warp filaments are provided as solid, generally flat metal conductive bands;
wherein at least some of the generally flat metal conductive warp bands include a plurality of generally flat metal conductive bands stacked in overlapping relation with one another; and
wherein at least some of said warp filaments are provided as round conductive monofilaments.

2. The fabric sleeve of claim 1 wherein at least some of said weft filaments are heat-set to bias said opposite sides into overlapping relation with one another.

3. The fabric sleeve of claim 1 wherein at least some of said weft filaments are provided as conductive filaments.

4. The fabric sleeve of claim 3 wherein at least some of said weft conductive filaments are individually served or twisted with individual ones of said heat-set weft filaments.

5. The fabric sleeve of claim 1 wherein each of said warp filaments is provided as said solid, generally flat metal conductive bands.

6. The fabric sleeve of claim 1 wherein at least some of said warp filaments are provided as nonconductive filaments.

7. The fabric sleeve of claim 6 wherein said nonconductive filaments are provided as multifilaments.

8. The fabric sleeve of claim 7 wherein said nonconductive multifilaments extend along at least one of said opposite sides.

9. The fabric sleeve of claim 6 wherein said nonconductive filaments are provided as monofilaments.

10. The fabric sleeve of claim 9 wherein said nonconductive monofilaments extend along at least one of said opposite sides.

11. The fabric sleeve of claim 1 wherein said warp filaments and said weft filaments are woven in a pattern selected from the group consisting of a plain weave pattern, a basket weave pattern, a twill weave pattern, and a mock leno weave pattern.

12. The fabric sleeve of claim 1 wherein at least some of said round conductive monofilaments are provided as a plurality of round conductive monofilaments grouped in substantially flat bundles.

13. The fabric sleeve of claim 12 wherein at least some of said substantially flat bundles extend adjacent said opposite sides.

14. The fabric sleeve of claim 13 wherein at least one of said substantially flat bundles extends generally intermediate said opposite sides.

15. The fabric sleeve of claim 13 further including at least one layer fixed to the woven substrate via stitches extending through said substantially flat bundles.

16. The fabric sleeve of claim 15 wherein said at least one layer includes an inner layer fixed to an inwardly facing surface of the woven substrate and an outer layer fixed to an outwardly facing surface of the woven substrate.

17. The fabric sleeve of claim 16 wherein said inner layer is an impervious sheet of material.

18. The fabric sleeve of claim 16 wherein said outer layer is a textile layer of interlaced material.

19. The fabric sleeve of claim 1 further including at least a pair of ground members woven with said weft filaments and extending between said opposite ends in overlapping relation with said generally flat metal conductive bands, said ground members being extendable axially beyond said opposite ends for operable connection to a ground.

20. The fabric sleeve of claim 19 wherein at least some of said generally flat metal conductive bands are stacked in overlying relation with one another, with said ground members being provided by one of said stacked generally flat metal conductive bands.

21. The fabric sleeve of claim 20 wherein said generally flat conductive ground member is woven in a different weave pattern with said weft filaments from the remaining generally flat metal conductive bands in stacked relation with said ground member.

22. A wrappable textile sleeve for protecting elongate members against at least one of EMI, RFI or ESD, comprising:
a plurality of warp filaments;
at least one weft filament;
said warp filaments being woven with said at least one weft filament to form a woven substrate, said substrate having opposite sides extending lengthwise between opposite ends, said opposite sides being wrappable about a central longitudinal axis of said sleeve into overlapping relation with one another; and
wherein at least some of said warp filaments are provided as generally flat conductive filaments; and
wherein at least some of said warp filaments are provided as round conductive monofilaments.

23. The fabric sleeve of claim 22 wherein at least some of said round conductive monofilaments are provided as a plurality of round conductive monofilaments grouped in substantially flat bundles.

24. The fabric sleeve of claim 23 wherein said substantially flat bundles extend adjacent said opposite sides.

25. The fabric sleeve of claim 23 further including at least one layer fixed to the woven substrate via stitches extending through said substantially flat bundles.

26. The fabric sleeve of claim 25 wherein said at least one layer includes an inner layer fixed to an inwardly facing surface of the woven substrate and an outer layer fixed to an outwardly facing surface of the woven substrate.

27. The fabric sleeve of claim 26 wherein said inner layer is an impervious sheet of material.

28. The fabric sleeve of claim 27 wherein said inner layer is a PTFE film.

29. The fabric sleeve of claim 26 wherein said outer layer is a textile layer of interlaced material.

30. The fabric sleeve of claim 29 wherein said outer layer is a textile layer including fire resistant filaments.

31. The fabric sleeve of claim 29 wherein said outer layer is a textile layer including PEEK filaments.

32. The fabric sleeve of claim 29 wherein said outer layer is a woven layer.

* * * * *